(12) United States Patent
Pekarski et al.

(10) Patent No.: US 10,019,897 B2
(45) Date of Patent: Jul. 10, 2018

(54) LIGHTING APPARATUS FOR INFRARED CAMERA SYSTEM COMPRISING ARRAY OF VERTICAL-CAVITY SURFACE-EMITTING LASERS

(71) Applicant: KONINKLIJKE PHILIPS N.V., Eindhoven (NL)

(72) Inventors: Pavel Pekarski, Aachen (DE); Stephan Gronenborn, Aachen (DE)

(73) Assignee: KONINKLIJKE PHILIPS N.C., Eindhoven (NL)

( * ) Notice: Subject to any disclaimer, the term of this patent is extended or adjusted under 35 U.S.C. 154(b) by 363 days.

(21) Appl. No.: 14/379,326

(22) PCT Filed: Feb. 22, 2013

(86) PCT No.: PCT/IB2013/051439
§ 371 (c)(1),
(2) Date: Aug. 18, 2014

(87) PCT Pub. No.: WO2013/124822
PCT Pub. Date: Aug. 29, 2013

(65) Prior Publication Data
US 2015/0022668 A1    Jan. 22, 2015

Related U.S. Application Data

(60) Provisional application No. 61/601,671, filed on Feb. 22, 2012.

(51) Int. Cl.
*G03B 15/02* (2006.01)
*G08G 1/04* (2006.01)
(Continued)

(52) U.S. Cl.
CPC ........... *G08G 1/04* (2013.01); *G02B 27/0905* (2013.01); *G02B 27/0927* (2013.01);
(Continued)

(58) Field of Classification Search
CPC .... G03B 15/02; G03B 15/03; G02B 27/0905; G02B 27/0927; G02B 27/0955;
(Continued)

(56) References Cited

U.S. PATENT DOCUMENTS 5,038,162 A * 8/1991 Tejima .................. G03B 17/06
396/140
5,758,951 A    6/1998 Haitz
(Continued)

FOREIGN PATENT DOCUMENTS

WO    2005085934 A1    9/2005
WO    2011021139 A2    2/2011
WO    2011021140 A2    2/2011

OTHER PUBLICATIONS

"Lasers and Laser-Related Equiptment-Test Methods for Laser Beam Widths . . . " ISO Standard 11146-1, First Edition Jan. 15, 2005.

*Primary Examiner* — Elmito Breval
*Assistant Examiner* — Naomi M Wolford

(57) ABSTRACT

The invention relates to a lighting apparatus (1) comprising an array (2) of light sources (3) emitting emission cones (4) with edges (5) which intersect in an intersection plane and a lens unit (7) for homogenizing the intensity distribution in the far field. The array of the light sources and the lens unit are arranged such that i) the emission cones traverse the lens unit and ii) the distance (s) between the array of the light sources and the lens unit deviates from the sum of or the difference between a) the focal length f of the lens unit and b) the distance t between the intersection plane and the array (2) of the light sources (3) by 20 percent or less. This configuration leads to an intermixture of the emission cones in the far field such that the intensity distribution in the far field is substantially homogeneous.

19 Claims, 6 Drawing Sheets

(51) Int. Cl.
*G02B 27/09* (2006.01)
*H01S 5/42* (2006.01)
*H04N 5/225* (2006.01)
*H04N 5/33* (2006.01)
*H01S 5/00* (2006.01)

(52) U.S. Cl.
CPC ..... *G02B 27/0955* (2013.01); *G02B 27/0961* (2013.01); *H01S 5/423* (2013.01); *H04N 5/2256* (2013.01); *H04N 5/33* (2013.01); *H01S 5/005* (2013.01)

(58) Field of Classification Search
CPC .... G02B 27/0961; H04N 5/33; H04N 5/2256; H01S 5/423; H01S 5/005
USPC .......................................................... 362/11
See application file for complete search history.

(56) References Cited

U.S. PATENT DOCUMENTS

| | | | |
|---|---|---|---|
| 6,384,981 B1 | 5/2002 | Hauschild | |
| 8,009,358 B2* | 8/2011 | Zalevsky | G02B 27/0927 359/618 |
| 2007/0091600 A1 | 4/2007 | Lerner | |
| 2009/0008530 A1* | 1/2009 | Wernersson | G03B 15/02 250/201.2 |
| 2010/0014274 A1* | 1/2010 | Shyu | G03B 15/02 362/11 |
| 2010/0097468 A1* | 4/2010 | Mayer | G02B 27/0911 348/148 |

* cited by examiner

LIGHTING APPARATUS FOR INFRARED CAMERA SYSTEM COMPRISING ARRAY OF VERTICAL-CAVITY SURFACE-EMITTING LASERS

CROSS-REFERENCE TO PRIOR APPLICATIONS

This application is the U.S. National Phase application under 35 U.S.C. § 371 of International Application No. PCT/IB2013/051439, filed on Feb. 22, 2012. These applications are hereby incorporated by reference herein.

FIELD OF THE INVENTION

The invention relates to a lighting apparatus and a lighting method. The invention relates further to a camera system comprising the lighting apparatus.

BACKGROUND OF THE INVENTION

Infrared camera systems for traffic surveillance or area security comprise cost effective and small illumination modules for generating radiation in the infrared wavelength range. These small illumination modules are generally light emitting diodes with an inhomogeneous intensity distribution in the far field of, for instance, a Gaussian shape. This results in an inhomogeneous illumination of an object to be imaged by the camera system and thus to an inhomogeneous image of the object.

SUMMARY OF THE INVENTION

It is an object of the present invention to provide a lighting apparatus and a lighting method, which provide a more homogeneous intensity distribution in the far field. It is a further object of the present invention to provide a camera system comprising the lighting apparatus, in order to allow the camera system to acquire a more homogeneous image of an object.

In a first aspect of the present invention a lighting apparatus is presented, wherein the lighting apparatus comprises
an array of light sources emitting emission cones, wherein the array of light sources is adapted such that the edges of the emission cones intersect in an intersection plane, and
an emission lens unit for homogenizing the intensity distribution in the far field,
wherein the array of the light sources and the emission lens unit are arranged such that i) the emission cones traverse the emission lens unit and ii) the distance between the array of the light sources and the emission lens unit deviates from the sum of or the difference between a) a focal length of the emission lens unit and b) the distance between the intersection plane and the array of the light sources by 20 percent or less.

Since the distance between the array of light sources and the emission lens unit deviates from the sum of or the difference between a) the focal length and b) the distance between the intersection plane and the array of the light sources by not more than 20 percent, i.e. since this deviation is not larger than 20 percent of the sum or of the difference, respectively, the distance between the array of light sources and the emission lens unit is substantially similar to the sum of or the difference between a) the focal length and b) the distance between the intersection plane and the array of light sources, thereby transforming the intersection plane with the intersecting edges of the emission cones to the far field and intermixing the emission cones in the far field. This leads to a more homogeneous intensity distribution in the far field.

It is preferred that the deviation of the distance between the array of light sources and the emission lens unit from the sum of or the difference between a) the focal length and b) the distance between the intersection plane and the array of light sources is 10 percent or smaller. It is further preferred that this deviation is 5 percent or smaller. In a further preferred embodiment the deviation is zero. A lighting apparatus having these small deviations of the distance between the array of light sources and the emission lens unit from the sum of or the difference between a) the focal length and b) the distance between the intersection plane and the array of light sources provides an intensity distribution in the far field having an even larger degree of homogeneity.

The emission lens unit preferentially comprises one or several optical lenses, in particular, refractive lenses, for transforming the intersection plane to the far field.

In an embodiment in the intersection plane edges of emission cones of neighboring light sources intersect. In another embodiment the light sources are equidistantly arranged with respect to each other, wherein between neighboring light sources a certain light source distance is present and wherein in the intersection plane the edges of emission cones of light sources, which have a distance with respect to each other being a multiple of the certain light source distance, intersect. If an intersection plane, in which the edges of emission cones of light sources that have a distance with respect to each other being a multiple of the certain light source distance intersect, is transformed to the far field by the emission lens unit, the intermixture of the emission cones of the individual light sources is stronger, thereby generating a further increased degree of homogeneity of the intensity distribution in the far field. Moreover, if in the intersection plane the edges of emission cones of light sources, which have a distance with respect to each other being a multiple of the certain light source distance, intersect, the intersection plane has a larger distance to the array of light sources than an intersection plane, in which the edges of emission cones of light sources, which have a distance with respect to each other being only the certain light source distance, intersect. This larger distance results in an intersection of more emission cones, thereby reducing the speckle contrast which also contributes to the increase of the degree of homogeneity of the intensity distribution in the far field.

The array of light sources is preferentially an array of vertical-cavity surface-emitting lasers (VCSELs). The VCSELs preferentially emit narrow beams, i.e. narrow emission cones, with a numerical aperture being smaller than 0.2. Moreover, the electro-optical efficiency of the VCSELs is preferentially relatively large. For instance, it can be 50 percent or larger.

In a preferred embodiment the light sources are infrared light sources. If the light sources are infrared light sources, the light cannot be seen by persons, thereby providing light for, for instance, a camera system, without disturbing a person.

The light sources may be arranged in a circle or in a rectangle. In particular, the light sources may be arranged in a square. By choosing the arrangement of the light sources as desired, a corresponding shape of the homogeneous illumination in the far field can be created. For instance, if the light sources are arranged in a circle or in a rectangle, the homogeneous illumination in the far field has the shape of a circle or of a rectangle, respectively.

The lighting apparatus is preferentially adapted to be used in a camera system having a viewing angle, wherein the lighting apparatus has an emission angle defined by the divergence of the light formed by the emission cones after having traversed the emission lens unit and wherein the lighting apparatus is adapted such that the viewing angle matches the emission angle. Preferentially, the viewing angle matches the emission angle, if the viewing angle is equal to or slightly smaller than the emission angle. The viewing angle can be regarded as being slightly smaller than the emission angle, if the deviation between the viewing angle and the emission angle is equal to or smaller than 20 percent, preferentially smaller than 10 percent and even further preferred smaller than 5 percent of the emission angle.

Preferentially, the intensity distribution generated by the array of the light sources and the emission lens unit in the far field comprises a central homogeneous part and a rim part having a decreasing intensity with increasing distance to the center of the intensity distribution. In this case the emission angle is preferentially defined by the angular position at which in the rim part the intensity is half of the intensity in the central homogeneous part. Moreover, in this case the lighting apparatus is preferentially adapted such that the central homogeneous part of the intensity distribution completely covers a viewing region in the far field defined by the viewing angle. This ensures that the viewing region is homogeneously illuminated such that an object, which is located in the viewing region, can be homogeneously imaged by the camera system.

Preferentially, the focal length of the emission lens unit is equal to or larger than two times the viewing angle in a direction being perpendicular to the optical axis of the emission lens unit divided by the extension of the array of light sources in the direction. In particular, the array of the light sources may form an emission rectangle having two first opposing sides with a first length in a first direction and two second opposing sides with a second length in a second direction, wherein the focal length of the emission lens unit is equal to or larger than two times the viewing angle in the first direction divided by the first length and/or the focal length of the emission lens unit is two times the viewing angle in the second direction divided by the second length.

In an embodiment the camera system comprises a light detector having a two-dimensional detection surface and a detection lens unit, wherein the two-dimensional detection surface and the detection lens unit define the viewing angle of the camera system and wherein the two-dimensional detection surface forms a detection rectangle having the same aspect ratio than the emission rectangle. For instance, the two-dimensional detection surface can be formed by a charge-coupled device (CCD) chip, wherein the dimensions of the CCD chip define together with the detection lens unit the viewing angle of the camera system. The array of light sources and the emission lens unit of the light apparatus are then preferentially adapted such that at least, further preferred only, the viewing region defined by the viewing angle is covered by the homogeneous intensity distribution generated by the light apparatus, thereby matching the viewing angle and the emission angle with respect to each other.

In an embodiment the light sources are equidistantly arranged with respect to each other, wherein between neighboring light sources a certain light source distance is present, wherein the distance between the intersection plane and the array of light sources is defined by the quotient of the certain light source distance and two times the tangent of the cone angle of the emission cones. In particular, the distance between the intersection plane and the array of light sources is the quotient or a multiple of the quotient.

The intersection plane is preferentially parallel to a plane, in which the array of light sources is arranged.

In a further aspect of the present invention a camera system for acquiring an image of an object is presented, wherein the camera system comprises:
the lighting apparatus as defined in claim 1 for illuminating the object,
a light detector for detecting light received from the object and for generating an image based on the received light.

Since the lighting apparatus illuminates the object more homogeneously, also the light received from the object and detected by the light detector is more homogeneous, thereby allowing the camera system to acquire a more homogeneous image of the object.

In a further aspect of the present invention a lighting method is presented, wherein emission cones are emitted by an array of light sources, wherein the edges of the emission cones intersect in an intersection plane, wherein the emission cones traverse an emission lens unit, wherein the distance between the array of light sources and the emission lens unit deviates from the sum of or the difference between a) a focal length of the emission lens unit and b) the distance between the intersection plane and the array of light sources by 20 percent or less.

It shall be understood that the lighting apparatus of claim 1, the camera system of claim 14 and the lighting method of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
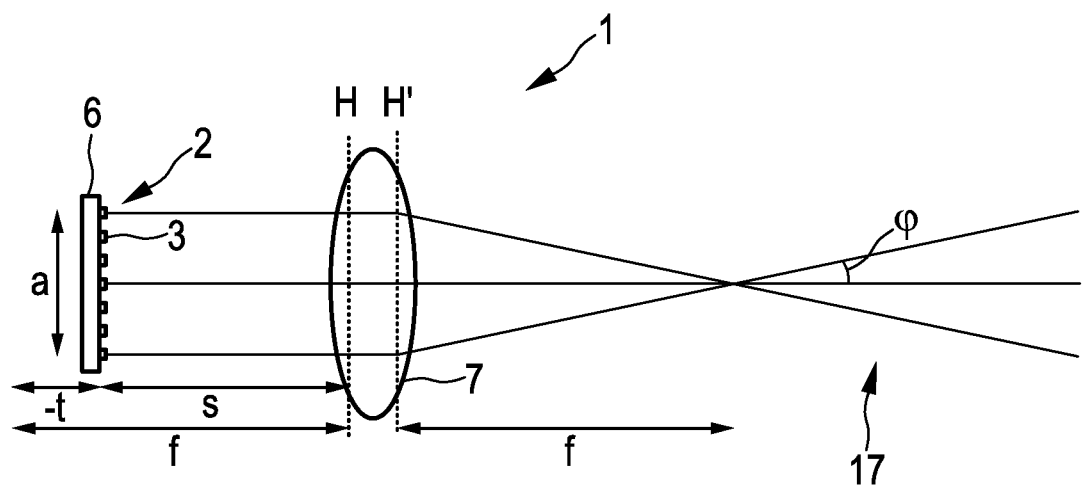
FIG. 1 shows schematically and exemplarily a lighting apparatus.
Figure 2:
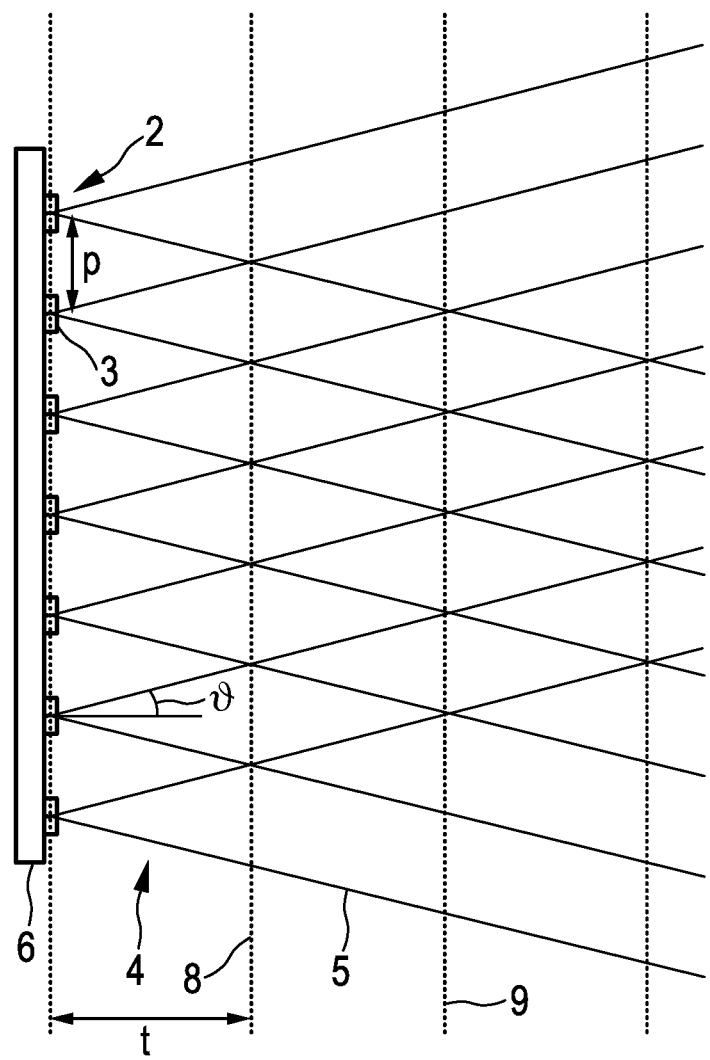
FIG. 2 illustrates intersection planes of the lighting apparatus.

FIG. 1 shows schematically and exemplarily a light apparatus 1 comprising an array 2 of light sources 3 emitting light emission cones 4, which are schematically and exemplarily illustrated in FIG. 2. The array 2 of light sources 3 is adapted such that the edges 5 of the emission cones 4 intersect in an intersection plane 8. In particular, the light sources 3 are equidistantly arranged on a support plate 6, wherein the light source distance between neighboring light sources 3 is indicated by reference sign p. The equidistantly arranged light sources 3 emit the emission cones 4 such that their edges 5 intersect in the intersection plane 8. In this embodiment, in the intersection plane 8 the edges 5 of emission cones 4 of neighboring light sources 3 intersect each other.

The light sources 3 are VCSELs emitting the emission cones 4 in the infrared wavelength range. They are arranged in a rectangle, in particular in a square. However, the light sources can also be arranged in another way. For instance, they can be arranged in a circle.

The distance t between the intersection plane 8 and the array 2 of light sources 3 is defined by the quotient of the certain light source distance p and two times the tangent of the cone angle ϑ of the emission cones 4. In this embodiment, the distance t between the intersection plane 8 and the array 2 of the light sources 3 is the quotient. Thus, the distance t can be calculated in accordance with following equation:

$$t = \frac{p}{2\tan\vartheta}. \quad (1)$$

The lighting apparatus 1 further comprises an emission lens unit 7 having a focal length f for homogenizing the intensity of the light emitted by the light sources 3 in the far field. The array 2 of the light sources 3 and the emission lens unit 7 are arranged such that i) the emission cones 4 traverse the emission lens unit 7 and ii) the distance s between the array 2 of the light sources 3 and the emission lens unit 7 is equal to the difference between a) the focal length f and b) the distance t between the intersection plane 8 and the array 2 of the light sources 3. In another embodiment, the distance between the array 2 of the light sources 3 and the emission lens unit 7 can also be equal to the sum of a) the focal length f and b) the distance t between the intersection plane 8 and the array 2 of the light sources 3. Moreover, in another embodiment the distance s between the array 2 of the light sources 3 and the emission lens unit 7 may deviate from the sum of or the difference between a) the focal length f and b) the distance t between the intersection plane 8 and the array 2 of the light sources 3 by 20 percent or less, preferentially by 10 percent or less, and even further preferred by 5 percent or less.

Although in FIG. 1 the lens unit 7 is indicated by a single lens only, the lens unit 7 can be any optical system for transforming the intersection plane 8 to the far field. In particular, the lens unit 7 can comprise several lenses for performing this transformation. In FIG. 1 H, H' exemplarily indicate principle planes of the lens unit 7.

In this embodiment the emission cones are fundamental Gaussian beams, wherein the edge 5 of the respective emission cone is defined by the full width at half maximum value of the respective fundamental Gaussian beam. If the emission cones are not fundamental Gaussian beams, the edges of the emission cones are preferentially defined by the standard divergence angle of the respective emission cone as defined by the ISO guideline. In particular, the edges of the emission cones can be defined by the standard divergence angle of the respective emission cone calculated by the second moment of the two-dimensional intensity distribution, for example, as described in ISO 11146-1:2005. After the emission cones have traversed the lens unit 7, they form intermixed light 17, which provides the homogeneous intensity distribution in the far field.

Figure 3:
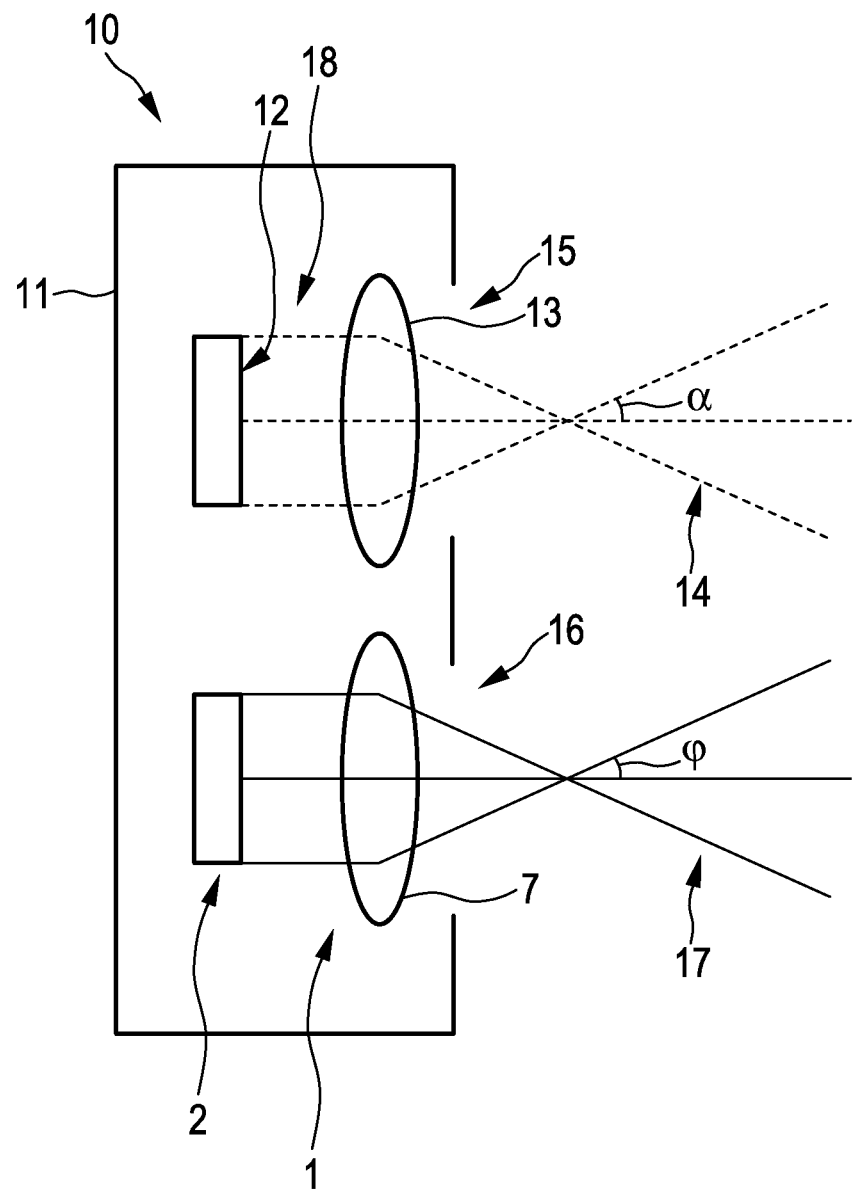
FIG. 3 shows schematically and exemplarily an embodiment of a camera system comprising the lighting apparatus.

FIG. 3 shows schematically and exemplarily an embodiment of a camera system for acquiring an image of an object. The camera system 10 comprises the lighting apparatus 1 for illuminating the object and a light detector 18 for detecting light received from the object and for generating an image based on the received light. The light detector 18 has a two-dimensional detection surface 12 and a detection lens unit 13, wherein the two-dimensional detection surface 12 and the detection lens unit 13 define the viewing angle α of the camera system 10. The light 14 received from the object is imaged onto the two-dimensional detection surface 12 for generating an image of the object.

The two-dimensional detection surface 12 is preferentially formed by a CCD chip. The detection lens unit 13 is preferentially a camera objective or another optical system for projecting the light 14 received from the object onto the two-dimensional detection surface 12.

The camera system further comprises a housing 11, in which the light detector 18 and the light apparatus 1 are arranged and which comprises openings 15, 16, in order to allow the light generated by the light apparatus 1 to leave the housing 11 and to allow the light reflected by the object to be detected by the light detector 18. The two-dimensional detection surface 12 has a rectangular shape, i.e. the two-dimensional detection surface 12 forms a detection rectangle. Also the array 2 of light sources 3 is arranged in a rectangle such that the array 2 of light sources 3 forms an emission rectangle. The detection rectangle and the emission rectangle have preferentially the same aspect ratio. This can ensure that the viewing region defined by the viewing angle α and the dimensions of the two-dimensional detection surface 12 and the homogeneously illuminated region in the far field have the same shape.

Moreover, the light apparatus 1 is preferentially adapted such that the emission angle φ defined by the divergence of the light 17 formed by the emission cones after having traversed the emission lens unit 7 matches the viewing angle α. This matching can ensure that not only the shapes of the viewing region of the camera system and of the homogeneous part of the intensity distribution in the far field are similar, but also that the viewing region and the homogeneous part of the intensity distribution in the far field have similar sizes. In particular, the intensity distribution generated by the array 2 of the light sources 3 and the emission lens unit 7 in the far field comprises a central homogeneous part 19 and a rim part 20 having a decreasing intensity with increasing distance to the center of the intensity distribution, wherein the lighting apparatus 1 is adapted such that the central homogeneous part 19 of the intensity distribution completely covers a view region in the far field defined by the viewing angle α as schematically and exemplarily shown in FIG. 4.

Figure 4:
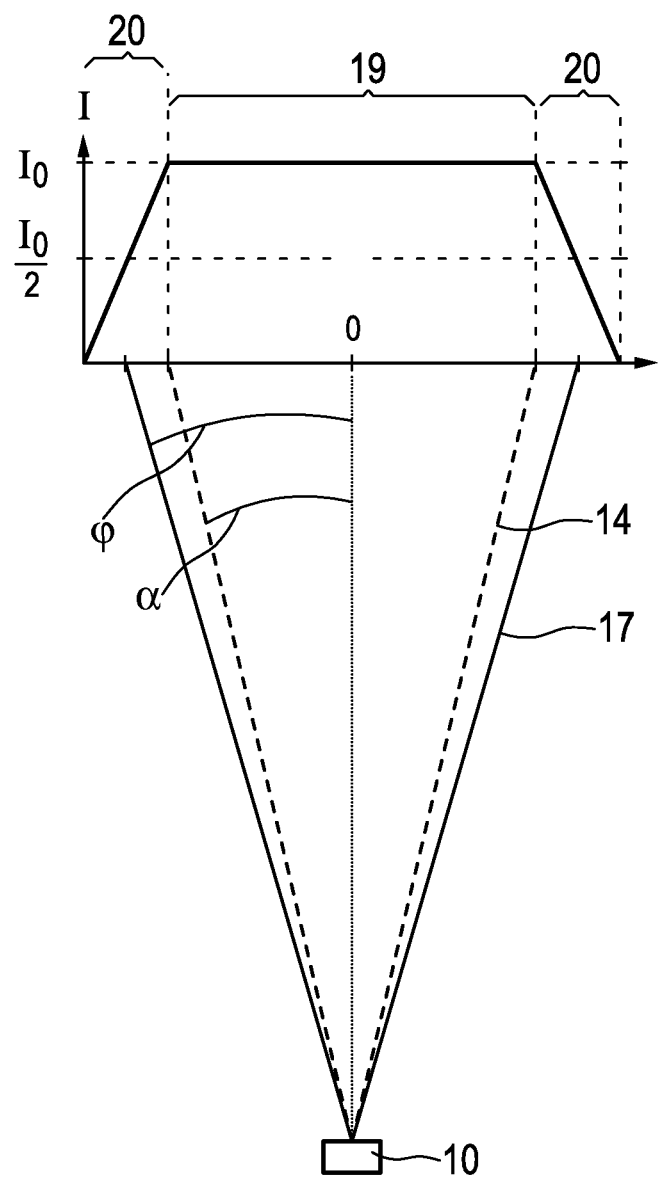
FIG. 4 illustrates schematically and exemplarily a preferred relation between a viewing angle and an emission angle of the camera system shown in FIG. 3.

In FIG. 4 I indicates the intensity and $I_0$ indicates the intensity in the homogeneous central part 19 of the intensity distribution. FIG. 4 illustrates the far field configuration such that the emission location, at which the array of light sources is located, and the detection location, at which the two-dimensional detection surface is located, can be regarded as being arranged at the same position.

As illustrated in FIG. 4, the emission angle φ is preferentially defined by the half of the maximum intensity $I_0$ and is slightly larger than the viewing angle α of the camera system 10 such that the homogeneous central part 19 of the intensity distribution, i.e. of the emission profile, matches, in particular exactly matches, the viewing field of the camera system 10. The homogeneous central part 19 of the intensity distribution in the far field can be defined by φ(1−p/2a).

Figure 5:
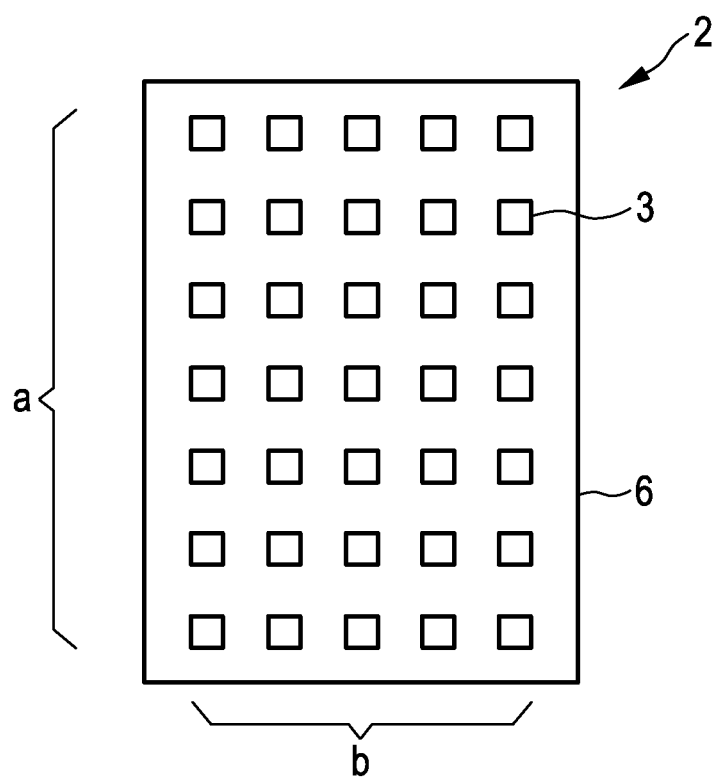
FIG. 5 shows schematically and exemplarily a top view on an array of light sources of the lighting apparatus.

In this embodiment the array 2 of the light sources 3 forms an emission rectangle having two first opposing sides with a first length a in a first direction and two second opposing sides with a second length b in a second direction. Such a configuration of the array 2 of the light sources 3 is schematically and exemplarily shown in FIG. 5. The focal length f of the emission lens unit 7 can be equal to or larger than the first length a divided by two times the viewing angle $\alpha_x$ in the first direction and larger than the second length b divided by two times the viewing angle $\alpha_y$ in the second direction. Thus, in a preferred embodiment the focal length f, the viewing angle $\alpha_x$, $\alpha_y$ in the first and second directions and the first and second lengths a, b can be related to each other in accordance with following equation:

$$f \geq \frac{a}{2\alpha_x} = \frac{b}{2\alpha_y}$$

Although in the above described embodiment the intersection plane 8 is defined as being the plane in which edges 5 of emission cones 4 of neighboring light sources 3 intersect, in other embodiments the intersection plane can also be defined as being the plane in which edges of emission cones of light sources, which have a distance with respect to each other being a multiple of the certain light source distance p, intersect. For instance, the intersection plane can be the plane indicated by reference number 9 in FIG. 2, in which edges of emission cones intersect, which are emitted by light sources having a distance with respect to each other being twice the certain light source distance p. If in the intersection plane the edges of emission cones of light sources, which have a distance with respect to each other being a multiple of the certain light source distance p, intersect, this distance t' can be defined by following equation:

$$t' = \frac{np}{2\tan\vartheta}, \quad (3)$$

wherein np denotes the distance between light sources, of which edges of emission cones intersect in the respective intersection plane. The distance t' can be regarded as being a multiple of the quotient defined in above equation (1). Moreover, if the intersection plane is defined as being the plane in which edges of emission cones of light sources, which have a distance with respect to each other being a multiple of the certain light source distance p, intersect, the homogeneous central part of the intensity distribution in the far field can be defined by $\varphi(1-np/2a)$.

Figure 6:
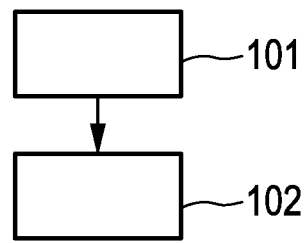
FIG. 6 shows a flowchart exemplarily illustrating an embodiment of a lighting method.

In the following an embodiment of a lighting method will exemplarily be described with reference to a flowchart shown in FIG. 6.

In step 101, emission cones are emitted by the array of light sources, wherein the edges of the emission cones intersect in the intersection plane. In step 102, the emission cones traverse an emission lens unit having a focal length, wherein the distance between the array of light sources and the emission lens unit deviates from the sum of or the difference between a) the focal length and b) the distance between the intersection plane and the array of light sources by 20 percent or less.

Known camera system comprise light emitting diodes, which emit light in the infrared wavelength region, for illuminating an object to be imaged. The light emitting diodes have a broad emission angle and an inhomogeneous far field, for instance, of a Gaussian shape, resulting in an inhomogeneous illumination of the object to be imaged and correspondingly in an inhomogeneous finally acquired image of the object. Moreover, energy outside of the viewing angle of the camera is wasted. Also VCSELs have Gaussian or even ring-shaped far fields without the use of optics. The lighting apparatus described above with reference to FIGS. 1 to 5 allows the generation of a homogeneous intensity profile in the far field, which can be tailored to the viewing angle of the camera system.

A VCSEL array with a small pitch p between the individual VCSELs and a lens with a focal length f in the distance s are used. The distance s is selected to optimize the homogeneity of the angular emission spectrum behind the lens, in particular in the far field, and can be calculated from the divergence angle $\vartheta$, i.e. the cone angles, of the emission cones of the VCSELs, their pitch p and the focal length f of the lens. The focal length f and the size of the VCSEL array, for instance the side length a and the side length b for a rectangular emission area of the VCSEL array, determine the emission angle $\varphi$ behind the lens, which is preferentially matched to the viewing angle of the camera system.

The pitch p, i.e. the distance between neighboring VCSELs, is preferentially selected as small as possible, restricted by the processing details like the minimum size of metal contacts between the lasers, oxidation width in case of oxide-confined VCSELs, et cetera. The total optical power needed in the respective application and the power of the individual VCSELs determine the number of the VCSELs within the area. The VCSELs are arranged on the supporting element being preferentially a chip in a desired shape of the illumination profile, for instance, in a circle or a rectangle like a square. For example, if the illumination profile should be a homogeneous rectangle with a side length ratio, i.e. an aspect ratio, of 4:3, the VCSELs can be arranged in a corresponding rectangle with the side lengths a and b=¾a. The lens unit of the light apparatus is then preferentially configured such that the focal length f of the lens unit leads to a size of the homogeneous part of the intensity distribution in the far field, which is similar to the size of the viewing region as defined by the viewing angle of the camera system.

The front focal plane of the lens is preferentially placed in a plane, where the emission cones of the lasers touch each other, i.e. where the edges of the emission cones intersect. This plane, i.e. the intersection plane, is preferentially located in a distance t, which is defined by equation (1) behind or before the VCSEL array. The cone angle $\vartheta$ of the laser beams preferentially depends on the emission profile. For a fundamental Gaussian laser beam $\vartheta$ is preferentially the full width at half maximum divided by two such that the points of 50 percent intensity of the neighboring emission cones overlap. For other beams, for instance, for a higher-order mode beam or a top-head shaped beam, $\vartheta$ is preferentially the standard divergence angle as defined by the ISO guideline.

An even better homogeneity can be achieved by selecting a plane, where the emission cones of VCSELs with the distance of np, wherein n is an integer number, touch each other, leading to a stronger intermixture of the emission profiles of the individual VCSELs. The distances t' of these planes behind and before the VCSEL array can be calculated in accordance with equation (3). However, this may introduce a decaying intensity at the rim of the homogeneous intensity profile with a length of (n−1) p.

The distance s between the VCSEL array and the lens unit, in particular the front main plane H of the lens unit, may be defined by s=f±t or s=f±t'. For s>f a real image of the VCSEL array can be created in the distance $u=(1/f-1/s)^{-1}$, which is preferentially well below the minimum viewing distance of the camera system, because it results in a grainy illumination pattern. For distances s<f no real image is formed and the intensity profile is homogeneous for all distances.

Preferentially in an intersection plane all intersections of edges of emission cones of VCSELs, which have the same distance of p or np to each other, are located. For instance, in the intersection plane 8 all intersections of edges of emission cones of VCSELs having a distance of p to each other can be located, and in the intersection plane 9 all intersections of edges of emission cones of VCSELs having a distance of 2p to each other can be located.

Although in the above described examples the array of light sources is preferentially an array of VCSELs, in other embodiments the light sources can also be other light sources like other lasers. In particular, the light sources can also be light emitting diodes.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A lighting apparatus comprising:
   an array of light sources emitting emission cones, wherein the array of light sources is adapted such that the edges of the emission cones intersect in an intersection plane; and
   an emission lens unit for homogenizing the intensity distribution in the far field,
   wherein the intersection plane is disposed between the array of light sources and the emission lens unit,
   wherein the array of the light sources and the emission lens unit are arranged such that the emission cones traverse the emission lens unit,
   wherein the array of the light sources and the emission lens unit are arranged such that a distance (s) between the array of the light sources and the emission lens unit deviates 20 percent or less from the sum of or the difference between,
   a focal length (f) of the emission lens unit and
   a distance (t) between the intersection plane and the array of the light sources.

2. The lighting apparatus as defined in claim 1, wherein in the intersection plane, edges of emission cones of neighboring light sources intersect.

3. The lighting apparatus as defined in claim 1,
   wherein the light sources are equidistantly arranged with respect to each other,
   wherein a distance (p) is arranged between neighboring light sources,
   wherein in the intersection plane the edges of emission cones of light sources of the light sources have a distance with respect to each other,
   wherein the distance is a multiple of the certain light source distance (p).

4. The lighting apparatus as defined in claim 1, wherein the array of light sources is an array of vertical-cavity surface-emitting lasers.

5. The lighting apparatus as defined in claim 1, wherein the light sources are infrared light sources.

6. The lighting apparatus as defined in claim 1, wherein the light sources are arranged in a rectangle.

7. The lighting apparatus as defined in claim 1, further comprising:
   a camera system,
   wherein the camera system has a viewing angle ($\alpha$),
   wherein the lighting apparatus has an emission angle ($\varphi$),
   wherein the emission angle ($\varphi$) is defined by the divergence of the light formed by the emission cones after having traversed the emission lens unit,
   wherein the lighting apparatus is arranged such that the viewing angle ($\alpha$) is less than or equal to the emission angle ($\varphi$).

8. The lighting apparatus as defined in claim 7,
   wherein the intensity distribution generated by the array of the light sources and the emission lens unit in the far field comprises a central homogeneous portion and a rim portion,
   wherein the rim portion has a decreasing intensity with increasing distance to the center of the intensity distribution,
   wherein the lighting apparatus is arranged such that the central homogeneous portion of the intensity distribution completely covers a viewing region in the far field defined by the viewing angle ($\alpha$).

9. The lighting apparatus as defined in claim 1, further comprising:
   a camera system,
   wherein the camera system has a viewing angle ($\alpha$),
   wherein the focal length (f) of the emission lens unit is
   wherein the focal length (f) of the emission lens unit is equal to or larger than the extension of the array of light sources in a direction perpendicular to an optical axis of the emission lens unit divided by two times the tangent of the viewing angle ($\alpha$).

10. The lighting apparatus as defined in claim 9,
    wherein the array of the light sources forms an emission rectangle, the emission rectangle having a first set of opposing sides and a second set of opposing sides, the first set of opposing sides having a first length (a) in a first direction and the second set of opposing sides having a second length (b) in a second direction,
    wherein the focal length (f) of the emission lens unit is equal to or larger than the first length (a) divided by two times the viewing angle ($\alpha$) in the first direction and the focal length (f) of the emission lens unit is equal to or larger than the second length (b) divided by two times the viewing angle($\alpha$) in the second direction.

11. The lighting apparatus as defined in claim 10 further comprising:
    a light detector, the light detector having a two-dimensional detection surface; and
    a detection lens unit,
    wherein the two-dimensional detection surface and the detection lens unit define the viewing angle ($\alpha$) of a camera system,
    wherein the two-dimensional detection surface forms a detection rectangle having the same aspect ratio as the emission rectangle.

12. The lighting apparatus as defined in claim 1,
    wherein the light sources are arranged equidistantly with respect to each other, wherein a distance (p) is arranged between neighboring light sources, wherein the distance (t) between the intersection plane and the array of light sources is defined by the quotient of the certain light source distance (p) and two times the tangent of the cone angle (ϑ) of the emission cones.

13. The lighting apparatus as defined in claim 12, wherein the distance between the intersection plane and the array of light sources is the quotient or a multiple of the quotient.

14. A system acquiring an image of an object comprising:
the lighting apparatus as defined in claim 1 for illuminating the object,
a light detector for detecting light received from the object.

15. The lighting apparatus as defined in claim 1, wherein the light sources are arranged in a circle.

16. A lighting method for use in a camera system,
wherein emission cones are emitted by an array of light sources,
wherein the edges of the emission cones intersect in an intersection plane,
wherein the emission cones traverse an emission lens unit,
wherein the intersection plane is disposed between the array of light sources and the emission lens unit,
wherein a distance between the array of the light sources and the emission lens unit deviates from the sum of or the difference between a) a focal length (f) and b) a distance between the intersection plane and the array of the light sources by 20 percent or less.

17. A lighting apparatus comprising:
an array of light sources emitting emission cones, wherein the array of light sources is arranged such that the edges of the emission cones intersect in an intersection plane,
wherein the array of the light sources forms an emission rectangle, the emission rectangle have a first set of opposing sides and a second set of opposing sides, the first set of opposing sides having a first length (a) in a first direction and the second set of opposing sides having a second length (b) in a second direction; and
an emission lens unit for homogenizing the intensity distribution in the far field,
wherein the intersection plane is disposed between the array of light sources and the emission lens unit,
wherein the array of the light sources and the emission lens unit are arranged such that the emission cones traverse the emission lens unit,
wherein the array of the light sources and the emission lens unit are arranged such that a distance (s) between the array of the light sources and the emission lens unit deviates 20 percent or less from the sum of or the difference between,
a focal length (f) of the emission lens unit and
a distance (t) between the intersection plane and the array of the light sources.

18. The lighting apparatus as defined in claim 17 further comprising a light detector, the light detector having a two-dimensional detection surface,
wherein the light detector has light detector aspect ratio,
wherein the a/b defines an emission rectangle aspect ratio,
wherein the emission rectangle aspect ratio is equal to the light detector aspect ratio.

19. The lighting apparatus as defined in claim 17 further comprising:
a detection lens unit,
wherein the two-dimensional detection surface and the detection lens unit define the viewing angle (α) of a camera system,
wherein the lighting apparatus has an emission angle (φ),
wherein the emission angle (φ) is defined by the divergence of the light formed by the emission cones after having traversed the emission lens unit,
wherein the lighting apparatus is arranged such that the viewing angle (α) is less than or equal to the emission angle (φ).

* * * * *